United States Patent
Kawakami et al.

(10) Patent No.: US 8,229,387 B2
(45) Date of Patent: Jul. 24, 2012

(54) EVEN HARMONIC MIXER

(75) Inventors: Kenji Kawakami, Tokyo (JP); Takuya Suzuki, Tokyo (JP); Ko Kanaya, Tokyo (JP); Yoichi Kitamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 453 days.

(21) Appl. No.: 12/526,432

(22) PCT Filed: Apr. 25, 2007

(86) PCT No.: PCT/JP2007/058945
§ 371 (c)(1),
(2), (4) Date: Aug. 7, 2009

(87) PCT Pub. No.: WO2008/136103
PCT Pub. Date: Nov. 13, 2008

(65) Prior Publication Data
US 2010/0315177 A1    Dec. 16, 2010

(51) Int. Cl.
*H04B 1/26* (2006.01)
(52) U.S. Cl. .......... 455/326; 455/333; 333/135
(58) Field of Classification Search .......... 455/284, 455/293, 323, 326, 327, 333, 334; 333/116, 333/135, 204, 296
See application file for complete search history.

(56) References Cited

U.S. PATENT DOCUMENTS

| 5,127,102 A | 6/1992 | Russell |
| 6,738,611 B1 * | 5/2004 | Politi ............... 455/302 |
| 6,879,192 B2 * | 4/2005 | Merenda ............ 327/113 |
| 8,036,627 B2 * | 10/2011 | Teillet et al. .......... 455/323 |
| 2004/0119646 A1 | 6/2004 | Ohno et al. |
| 2006/0040637 A1 | 2/2006 | Kanaya |
| 2006/0086997 A1 | 4/2006 | Kanaya et al. |
| 2007/0072573 A1 | 3/2007 | Kawakami et al. |

FOREIGN PATENT DOCUMENTS

| CN | 1373928 A | 10/2002 |
| JP | 63 198428 | 8/1988 |
| JP | 2-64467 | 3/1990 |

(Continued)

OTHER PUBLICATIONS

Office Action issued May 23, 2011 in China Application No. 200780051986.3.
Office Action issued Jul. 12, 2011, in Japanese Patent Application No. 2009-512835.

(Continued)

Primary Examiner — Nhan Le
(74) Attorney, Agent, or Firm — Oblon, Spivak, McClelland, Maier & Neustadt, L.L.P.

(57) ABSTRACT

Provided is an even harmonic mixer which is reduced in cost and size. The even harmonic mixer includes: a transducer in which a conductor of a microstrip line is connected to a ground plane of a waveguide, for transducing an RF signal transmitted in a waveguide mode into a transmission mode of the microstrip line; an anti-parallel diode pair which is cascade-connected to a microstrip line side of the transducer, and formed on a semiconductor substrate; a branching circuit for branching an LO signal and an IF signal; an open-end stub which is disposed between the transducer and the anti-parallel diode pair, and has a line length of about ½ wavelength at an RF signal frequency; and an open-end stub which is disposed between the anti-parallel diode pair and the branching circuit, and has a line length of about ¼ wavelength at the RF signal frequency.

8 Claims, 3 Drawing Sheets

FOREIGN PATENT DOCUMENTS

| | | |
|---|---|---|
| JP | 2-107009 | 4/1990 |
| JP | 4-310005 | 11/1992 |
| JP | 6-152252 | 5/1994 |
| JP | 8-250936 | 9/1996 |
| JP | 10 284942 | 10/1998 |
| JP | 2002 344333 | 11/2002 |
| JP | 2004 112783 | 4/2004 |
| JP | 2004-112783 | 4/2004 |
| JP | 2006 60533 | 3/2006 |
| JP | 2006 120898 | 5/2006 |
| WO | WO 02/05417 A1 | 1/2002 |
| WO | 2005 043744 | 5/2005 |

OTHER PUBLICATIONS

Maas, S., "8.4.2 Microstrip SHP Mixer", Microwave Mixers Second Edition, Artech House Boston London, p. 311 (Dec. 1, 1993).

Aikawa, M. et al. "Monolithic Microwave Integrated Circuit (MMIC)", The Institute of Electronics, Information and Communication Engineers Edition, pp. 120-122 (Jan. 25, 1997).

\* cited by examiner

F I G. 5
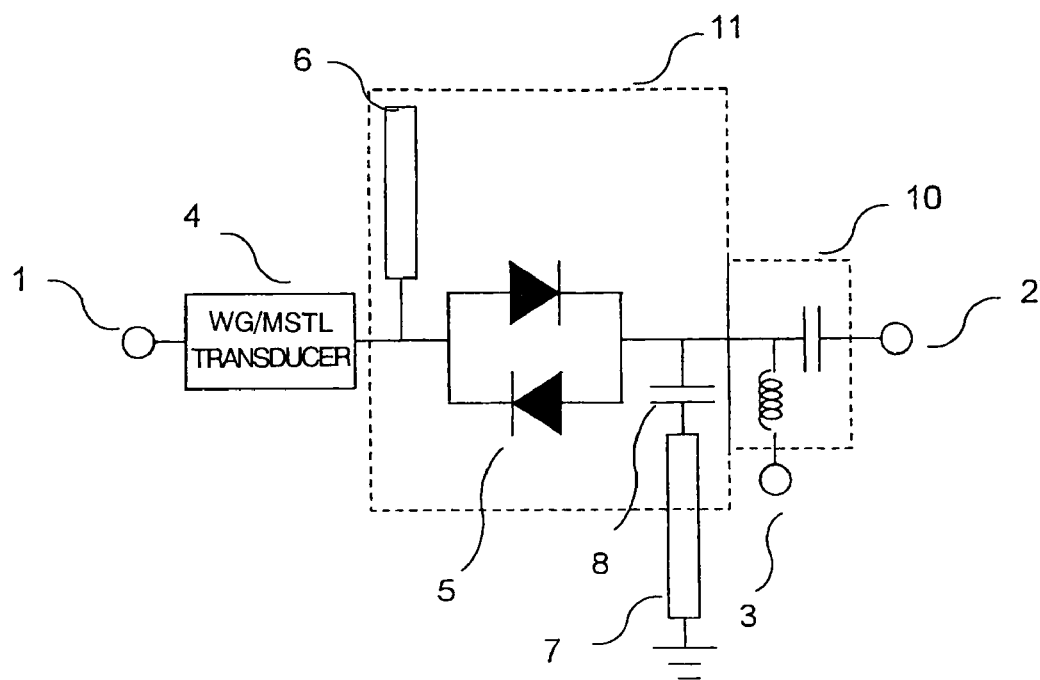
F I G. 6
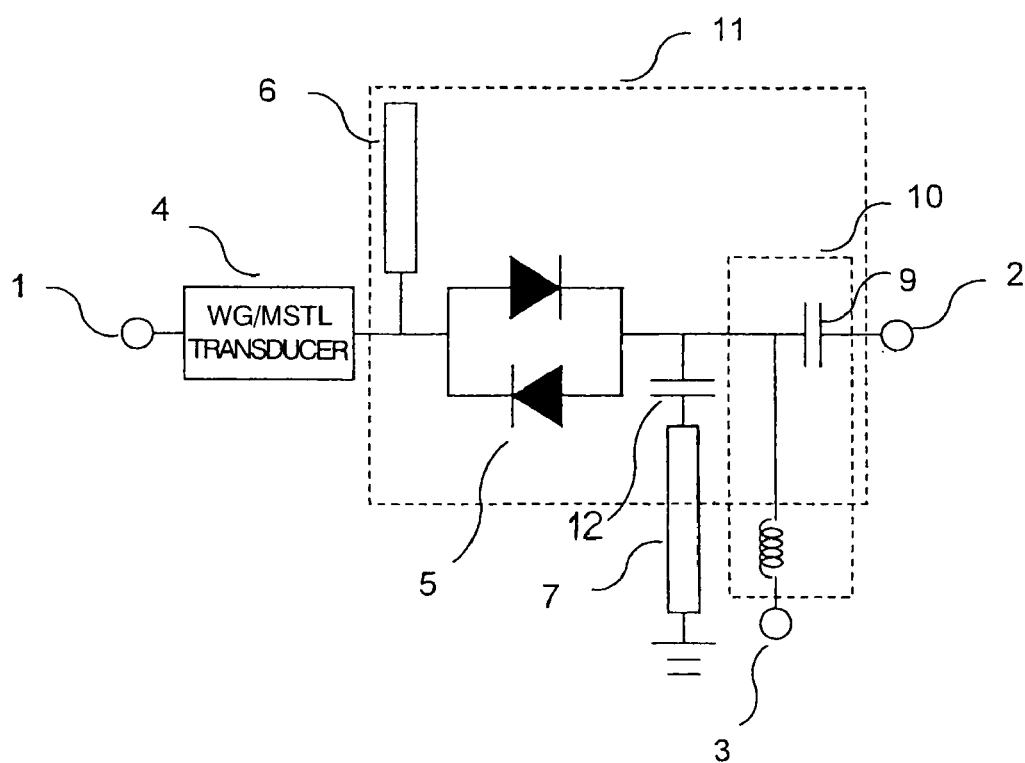

EVEN HARMONIC MIXER

TECHNICAL FIELD

The present invention relates to an even harmonic mixer used in a communication device, a radar device, or the like.

BACKGROUND ART

As a conventional mixer, there is a stub branching mixer using an anti-parallel diode pair (APDP). The mixer is a mixer to which a radio frequency (RF) signal and a local oscillator frequency (LO) signal are input, and which extracts a component of (RF signal frequency−2×LO signal frequency) with the use of diodes connected in anti-parallel to each other (for example, refer to Non-patent Documents 1 and 2).

Further, a general mixer using an open stub and a short stub is disclosed (for example, refer to Patent Documents 1 and 2). Further, as a line transducer used for the mixer, there is disclosed a waveguide/microstrip line transducer having a configuration in which a conductor is connected to a ground plane of a waveguide (for example, refer to Patent Documents 3 and 4). Further, there is disclosed a configuration in which a resistor that divides a voltage applied to the APDP is provided to thereby increase a ratio of an output power when the RF signal is on, and an output power when the RF signal is off (for example, refer to Patent Document 5).

Non-patent Document 1: "8.4.2 Microstrip SHP Mixer", Microwave Mixers Second Edition, Stephen A. Maas, p. 311

Non-patent Document 2: The Institute of Electronics, Information and Communication Engineers "Monolithic Microwave Integrated Circuit (MMIC)" pp. 120-122

Patent Document 1: JP 2980033 B
Patent Document 2: JP 3147852 B
Patent Document 3: JP 3672241 B
Patent Document 4: JP 3828438 B
Patent Document 5: WO 2005/043744 A1

DISCLOSURE OF THE INVENTION

Problem to be Solved by the Invention

However, the conventional mixer is designed with the main aim of satisfying a function and performance of the mixer alone. However, there arises a problem that the costs and the size must be reduced by optimizing a mixer circuit configuration particularly in a state where the mixer is incorporated into a module at a millimeter waveband.

The present invention has been made in view of the above-mentioned viewpoints, and therefore has an object to provide an even harmonic mixer which is reduced in cost and size, and to which an RF signal input from a waveguide is input via a waveguide/microstrip transducer in which a conductor of a microstrip line is connected to a ground plane of the waveguide, with a structure in which the transducer serves to short-circuit an IF signal and DC short-circuit a diode.

Means for Solving the Problem

An even harmonic mixer according to the present invention comprises: a transducer in which a conductor of a microstrip line is connected to a ground plane of a waveguide, for transducing an RF signal transmitted in a waveguide mode into a transmission mode of the microstrip line; an anti-parallel diode pair which is cascade-connected to a microstrip line side of the transducer, and formed on a semiconductor substrate; a branching circuit for branching an LO signal and an IF signal; an open-end stub which is disposed between the transducer and the anti-parallel diode pair, and has a line length of about ½ wavelength at an RF signal frequency; and an open-end stub which is disposed between the anti-parallel diode pair and the branching circuit, and has a line length of about ¼ wavelength at the RF signal frequency or an open-end stub which is disposed through a capacitor for cutting off the IF signal between the anti-parallel diode pair and the branching circuit, and has a line length of about ½ wavelength at the RF signal frequency.

Effect of the Invention

According to the present invention, there may be obtained the even harmonic mixer which is reduced in cost and size, and to which the RF signal input from the waveguide is input via the waveguide/microstrip transducer in which the conductor of the microstrip line is connected to the ground plane of the waveguide, with the structure in which the transducer serves to short-circuit the IF signal and DC short-circuit the diode.

BRIEF DESCRIPTION OF THE DRAWINGS

[FIG. 5] A circuit block diagram illustrating an even harmonic mixer according to Embodiment 5 of the present invention.

[FIG. 6] A circuit block diagram illustrating an even harmonic mixer according to Embodiment 6 of the present invention.

BEST MODE FOR CARRYING OUT THE INVENTION

Embodiment 1

Figure 1:
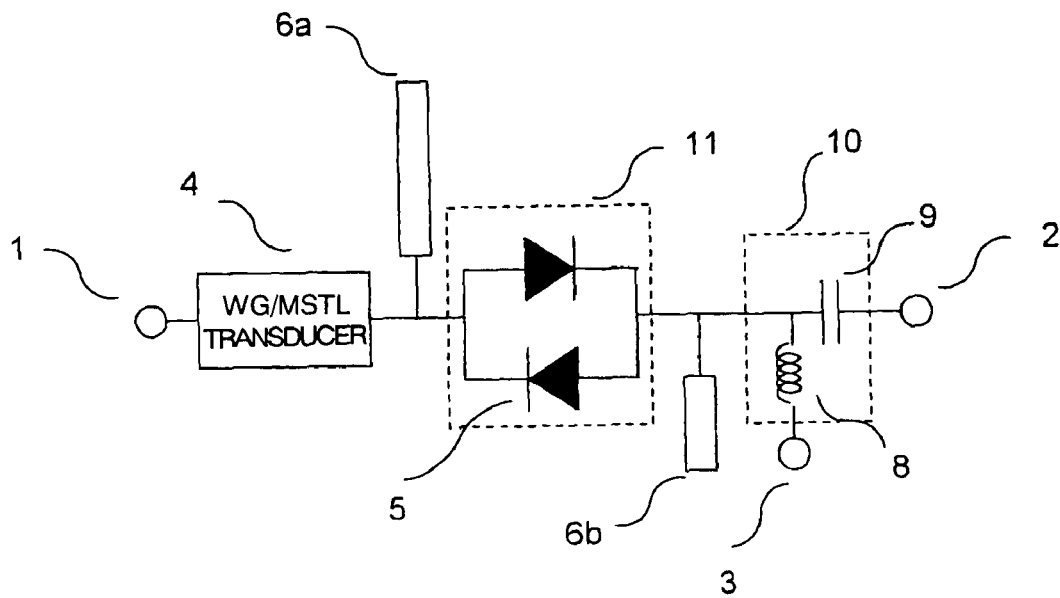
[FIG. 1] A circuit block diagram illustrating an even harmonic mixer according to Embodiment 1 of the present invention.

FIG. 1 is a circuit block diagram illustrating an even harmonic mixer according to Embodiment 1 of the present invention. The even harmonic mixer illustrated in FIG. 1 has a configuration in which a conductor of a microstrip line is connected to a ground plane of a waveguide between an RF terminal 1 to which an RF signal is input, and an LO terminal 2 to which an LO signal having a frequency of about ½ of the RF signal is input. The even harmonic mixer includes: a waveguide/microstrip (WG/MSTL) transducer 4 that transduces the RF signal transmitted in a waveguide mode into a transmission mode of the microstrip line; an anti-parallel diode pair 5 which is cascade-connected to the microstrip line side of the transducer 4, and includes diodes connected in anti-parallel to each other and formed on a semiconductor substrate 11; and a branching circuit 10 for branching the LO signal and the IF signal, which includes an inductor 8 for allowing the IF signal to pass therethrough and for cutting off signals having a frequency higher than the IF signal, and a capacitor 9 for cutting off the IF signal.

Then, an open-end stub 6a having a line length of about ½ wavelength at a frequency of the RF signal is disposed between the transducer 4 and the anti-parallel diode pair 5, and an open-end stub 6b having a line length of about ¼ wavelength at the frequency of the RF signal is disposed between the anti-parallel diode pair 5 and the branching circuit 10. Reference numeral 3 is an IF terminal.

Subsequently, the operation is described. As in the conventional example, the even harmonic mixer according to Embodiment 1 is a mixer to which the RF signal and the LO signal are input, and which extracts a component of (RF signal frequency−2×LO signal frequency) with the use of the diode pair 5 connected in anti-parallel to each other. It seems that the open-end stub 6a disposed on the RF terminal 1 side of the diode pair 5 is short-circuited with respect to the LO signal. When attention is paid to the fact that the diodes included in the diode pair 5 are opposite in direction to each other, the component of the LO signal frequency is applied to the respective diodes in opposite directions to each other.

On the other hand, with respect to the RF signal having a frequency substantially twice as high as the LO signal frequency, it seems that the open-end stub 6b disposed on the LO terminal 2 side of the diode pair 5 is short-circuited, and it seems that the open-end stub 6a disposed on the RF terminal 1 side is opened. Therefore, the RF signal is supplied in reverse phase. Accordingly, the components of (RF signal frequency−2×LO signal frequency) being the IF signal are reserve in phase to each other, and hence the components are added from the diode pair 5 whose diodes are connected in reverse polarity, and can be extracted.

In this case, when there is used the waveguide/microstrip transducer 4 having a characteristic so as to be short-circuited at a frequency lower than the pass band of the waveguide, the short-circuit of the IF signal and the DC short-circuit of the diodes can be both configured by the waveguide/microstrip transducer 4. Accordingly, the generated IF signal component is output to the LO terminal 2 side of the diode pair 5, and output to the IF terminal 3 through the branching circuit 10. Further, the components of the generated (2×LO signal frequency) are short-circuited by the open-end stub 6b, and are not leaked to the RF terminal 1 because the components are reverse in phase to each other on the RF terminal 1 side.

In the waveguide/microstrip transducer 4, the LO signal frequency is at a cutoff band, and hence the LO signal wave is totally reflected. In the conventional configuration, a standing wave caused by reflecting the LO signal wave is generated to deteriorate the mixer characteristic. On the other hand, in the configuration of this embodiment, a distance between the open-end stub 6a being a short-circuit point and the waveguide/microstrip transducer 4 is made shorter, resulting in an advantage that those members can be regarded as one short-circuit point and do not affect the mixer characteristic.

Further, a reduction in the costs can be expected by decreasing a chip area of the semiconductor substrate 11 into which the diodes are incorporated, and which is formed of the most expensive material such as GaAs among the elements constituting the mixer.

Further, in the conventional example, the short-circuit of the IF signal and the DC short-circuit of the diodes are configured by using the short-end stub having an electric length of ½ wavelength at the RF frequency for RF signal short-circuit. On the other hand, in the configuration of this embodiment, a via-hole for short-circuit is not required, which leads to a reduction in the costs. Further, the stub length may be ¼ wavelength at the RF frequency, and hence it is advantageous in that the size can be reduced.

Further, in the mounting at the millimeter waveband, a connection between the semiconductor substrate 11 and an external circuit such as a mother substrate is made by flip-chip mounting, thereby enabling a mixer smaller in variation than the conventional wire connection to be realized.

In the above-mentioned description, the operation of the frequency down converter is described. However, the mixer according to Embodiment 1 is a diode mixer, and hence the same operation can be executed even as an up converter.

Embodiment 2

Figure 2:
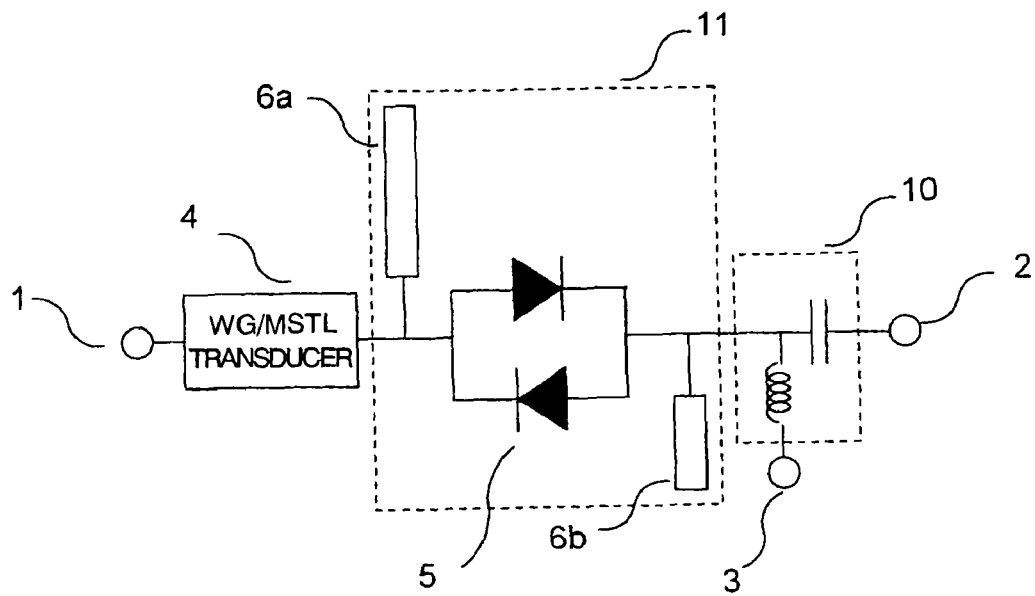
[FIG. 2] A circuit block diagram illustrating an even harmonic mixer according to Embodiment 2 of the present invention.

FIG. 2 is a circuit block diagram illustrating an even harmonic mixer according to Embodiment 2 of the present invention. In a configuration according to Embodiment 2 illustrated in FIG. 2, the same configurations as those of Embodiment 1 illustrated in FIG. 1 are denoted by identical symbols, and their description is omitted. In the configuration according to Embodiment 2 illustrated in FIG. 2, a difference from Embodiment 1 illustrated in FIG. 1 resides in that all (or a part) of the two open-end stubs 6a and 6b are formed on the semiconductor substrate 11 in addition to the diode pair 5.

In Embodiment 1 described above, a connection line on the semiconductor substrate 11, a wire or a bump formed at the time of the flip-chip mounting, and a connection line on the mother substrate intervene between the diode pair 5 and each of the stubs 6a and 6b, and the mixer characteristic is deteriorated according to the phase thereof. On the contrary, in the configuration according to Embodiment 2 illustrated in FIG. 3, the stubs 6a and 6b can be formed in close proximity to the diode pair 5, and hence it is advantageous in that the characteristic deterioration can be minimized. Further, the same effect can be obtained even when a part of the two open-end stubs 6a and 6b is formed outside the semiconductor substrate 11, that is, on the mother substrate. Other effects are identical with those of Embodiment 1.

Embodiment 3

Figure 3:
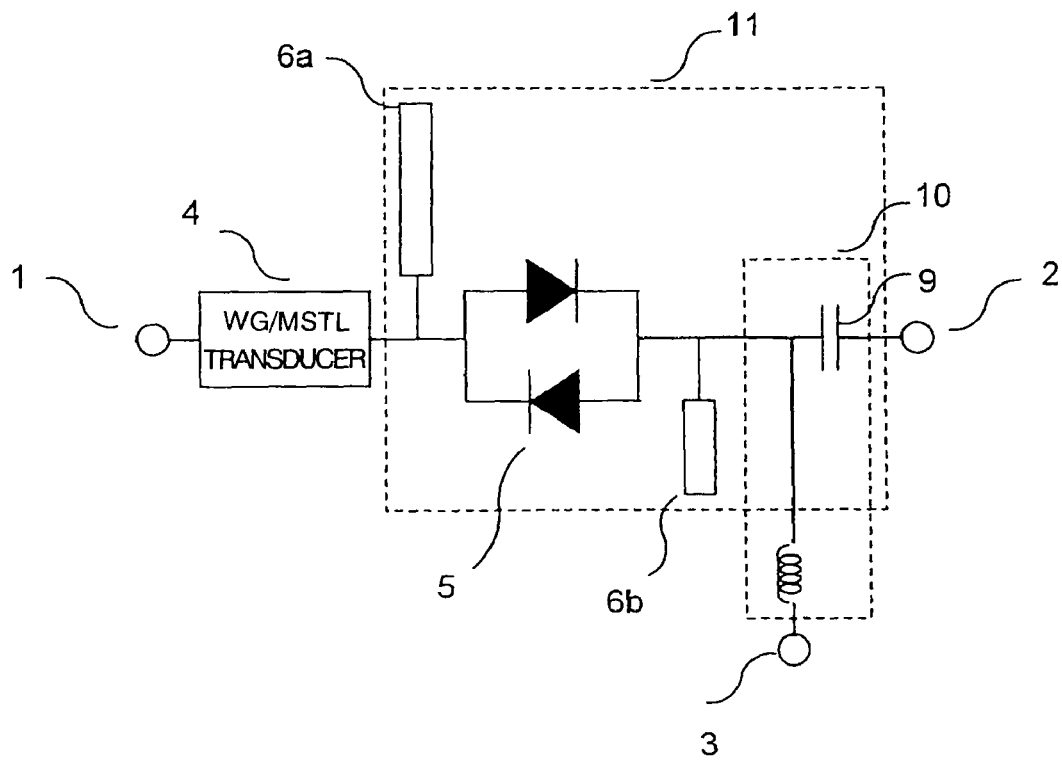
[FIG. 3] A circuit block diagram illustrating an even harmonic mixer according to Embodiment 3 of the present invention.

FIG. 3 is a circuit block diagram illustrating an even harmonic mixer according to Embodiment 3 of the present invention. In a configuration according to Embodiment 3 illustrated in FIG. 3, the same configurations as those of Embodiment 2 illustrated in FIG. 2 are denoted by identical symbols, and their description is omitted. In the configuration according to Embodiment 3 illustrated in FIG. 3, a difference from Embodiment 2 illustrated in FIG. 2 resides in that the capacitor 9 used in the branching circuit 10 is further formed on the semiconductor substrate 11 in addition to the diode pair 5 and all (or a part) of the two open-end stubs 6a and 6b.

In Embodiments 1 and 2 described above, the capacitor for IF frequency cutoff, which is used in the branching circuit 10, is formed on the mother substrate. On the other hand, in Embodiment 3, the capacitor 9 used in the branching circuit 10 is formed of an MIM capacitor on the semiconductor substrate 11, thereby enabling the IF frequency cutoff to be realized with the reduced size. Other effects are identical with those of Embodiments 1 and 2.

Embodiment 4

Figure 4:
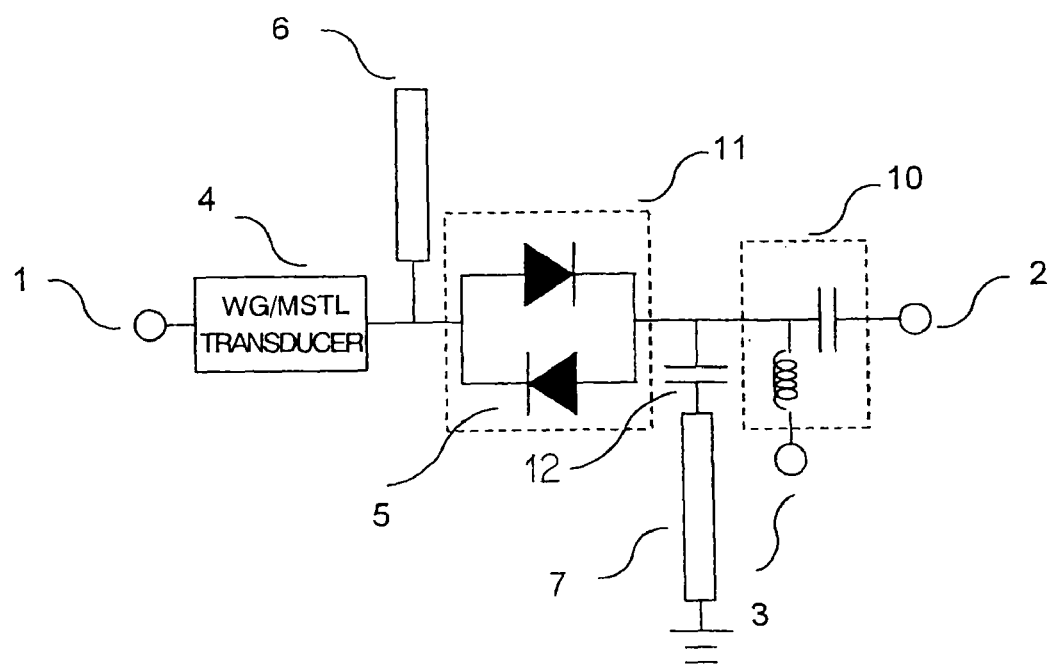
[FIG. 4] A circuit block diagram illustrating an even harmonic mixer according to Embodiment 4 of the present invention.

FIG. 4 is a circuit block diagram illustrating an even harmonic mixer according to Embodiment 4 of the present invention. In a configuration according to Embodiment 4 illustrated in FIG. 4, the same configurations as those of Embodiment 1 illustrated in FIG. 1 are denoted by identical symbols, and their description is omitted. In the configuration according to Embodiment 4 illustrated in FIG. 4, a difference from Embodiment 1 illustrated in FIG. 1 resides in that a series-connected part including a capacitor 12 for cutting off the IF signal and a short-end stub 7 having a line length of about ½ wavelength at the RF signal frequency is disposed between the diode pair 5 and the branching circuit 10 instead of the open-end stub 6b.

The operation of the even harmonic mixer according to Embodiment 4 is identical with that of Embodiment 1, and therefore its description is omitted. In the waveguide/microstrip transducer 4 illustrated in FIG. 4, the LO signal frequency is at a cutoff band, and hence the LO signal wave is totally reflected. In the conventional configuration, a standing wave caused by reflecting the LO signal wave is generated to deteriorate the mixer characteristic. On the other hand, in the configuration of this embodiment, the distance between the open-end stub 6a being a short-circuit point and the waveguide/microstrip transducer 4 is made shorter, resulting in the same advantage as that of Embodiment 1 that those members can be regarded as one short-circuit point, and do not affect the mixer characteristic.

Further, a reduction in the costs can be expected by decreasing a chip area of the semiconductor substrate 11 into which the diode pair 5 is incorporated, and which is formed of the most expensive material such as GaAs among the elements constituting the mixer.

Further, the open-end stub 6 having the line length of ¼ wavelength at the RF signal frequency in Embodiment 1 is replaced by the short-end stub 7 having the line length of ½ wavelength at the RF signal frequency. As a result, it seems that the short-end stub 7 is opened in the LO signal wave, and an impedance change when the LO signal wave is input to the diodes can be reduced.

Further, in the mounting at the millimeter waveband, a connection between the semiconductor substrate 11 and an external circuit such as a mother substrate is made by flip-chip mounting, thereby enabling a mixer smaller in variation than the conventional wire connection to be realized.

In the above-mentioned description, the operation of the frequency down converter is described. However, the mixer according to Embodiment 4 is a diode mixer, and hence the same operation can be executed even as an up converter.

Embodiment 5

FIG. 5 is a circuit block diagram illustrating an even harmonic mixer according to Embodiment 5 of the present invention. In a configuration according to Embodiment 5 illustrated in FIG. 5, the same configurations as those of Embodiment 4 illustrated in FIG. 4 are denoted by identical symbols, and their description is omitted. In the configuration according to Embodiment 5 illustrated in FIG. 5, a difference from Embodiment 4 illustrated in FIG. 4 resides in that all (or a part) of the open-end stub 6, the capacitor 8 for cutting off the IF signal, and a part of the short-end stub 7 are formed on the semiconductor substrate 11 in addition to the diode pair 5.

The operation of the even harmonic mixer according to Embodiment 5 is identical with that of Embodiment 4, and therefore its description is omitted.

In Embodiment 4 described above, a connection line on the semiconductor substrate 11, a wire or a bump formed at the time of the flip-chip mounting, and a connection line on the mother substrate intervene between the diode pair 5 and each of the stubs 6 and 7, and the mixer characteristic is deteriorated according to the phase thereof. On the contrary, in the configuration according to Embodiment 5 illustrated in FIG. 5, the stubs 6 and 7 can be formed in close proximity to the diode pair 5, and hence it is advantageous in that the characteristic deterioration can be minimized. Further, the same effect can be obtained even when a part of the open-end stub 6 is formed outside the semiconductor substrate 11, that is, on the mother substrate, and there is an effect to reduce the area of the semiconductor substrate 11. Other effects are identical with those of Embodiment 4.

Embodiment 6

FIG. 6 is a circuit block diagram illustrating an even harmonic mixer according to Embodiment 6 of the present invention. In a configuration according to Embodiment 6 illustrated in FIG. 6, the same configurations as those of Embodiment 5 illustrated in FIG. 5 are denoted by identical symbols, and their description is omitted. In the configuration according to Embodiment 6 illustrated in FIG. 6, a difference from Embodiment 5 illustrated in FIG. 5 resides in that the capacitor 9 used in the branching circuit 10 is further formed on the semiconductor substrate 11 in addition to the diode pair 5, all (or a part) of the open-end stub 6, the capacitor 8 for cutting off the IF signal, and a part of the short-end stub 7.

The operation of the even harmonic mixer according to Embodiment 6 is identical with that of Embodiment 4, and therefore its description is omitted.

Here, all or a part of the open-end stub 6, the capacitor 12, a part of the short-end stub 7, and the capacitor 9 used in the branching circuit 10 are formed on the semiconductor substrate 11. In Embodiment 4, a connection line on the semiconductor substrate 11, a wire or a bump formed at the time of the flip-chip mounting, and a connection line on the mother substrate intervene between the diode pair 5 and each of the stubs 6 and 7, and the mixer characteristic is deteriorated according to the phase thereof. On the contrary, in the configuration according to Embodiment 6 illustrated in FIG. 6, the stubs 6 and 7 can be formed in close proximity to the diode pair 5, and hence it is advantageous in that the characteristic deterioration can be minimized. Further, the same effect can be obtained even when a part of the open-end stub 6 is formed outside the semiconductor substrate 11, that is, on the mother substrate, and there is an effect to reduce the area of the semiconductor substrate 11.

Further, in Embodiment 6, the capacitor for the IF frequency cutoff, which is formed on the mother substrate, is formed of the MIM capacitor on the semiconductor substrate 11, thereby enabling the IF frequency cutoff to be realized with the reduced size. Other effects are identical with those of Embodiment 4.

Industrial Applicability

The even harmonic mixer according to the present invention can be widely used in a communication device, a radar device, or the like.

The invention claimed is:

1. An even harmonic mixer, comprising:
   a transducer in which a conductor of a microstrip line is connected to a ground plane of a waveguide to transduce an RF signal transmitted in a waveguide mode into a transmission mode of the microstrip line;
   an anti-parallel diode pair which is cascade-connected to a microstrip line side of the transducer, and formed on a semiconductor substrate;
   a branching circuit for branching an LO signal and an IF signal;
   an open-end stub which is disposed between the transducer and the anti-parallel diode pair, and has a line length of ½ wavelength at an RF signal frequency; and
   an open-end stub which is disposed between the anti-parallel diode pair and the branching circuit, and has a line length of ¼ wavelength at the RF signal frequency.

2. The even harmonic mixer according to claim 1, wherein all or a part of the two open-end stubs are formed on the semiconductor substrate.

3. The even harmonic mixer according to claim 2,
wherein the branching circuit includes an inductor for allowing the IF signal to pass therethrough, and a capacitor for cutting off the IF signal, and
wherein the capacitor used in the branching circuit is further formed on the semiconductor substrate.

4. An even harmonic mixer, comprising:
a transducer in which a conductor of a microstrip line is connected to a ground plane of a waveguide to transduce an RF signal transmitted in a waveguide mode into a transmission mode of the microstrip line;
an anti-parallel diode pair which is cascade-connected to a microstrip line side of the transducer, and formed on a semiconductor substrate;
a branching circuit for branching an LO signal and an IF signal;
an open-end stub which is disposed between the transducer and the anti-parallel diode pair, and has a line length of ½ wavelength at an RF signal frequency; and
a short-end stub which is disposed through a capacitor for cutting off the IF signal between the anti-parallel diode pair and the branching circuit, and has a line length of ½ wavelength at the RF signal frequency.

5. The even harmonic mixer according to claim 4, wherein all or a part of the open-end stub, the capacitor, and a part of the short-end stub are formed on the semiconductor substrate.

6. The even harmonic mixer according to claim 5,
wherein the branching circuit includes an inductor for allowing the IF signal to pass therethrough, and the capacitor for cutting off the IF signal, and
wherein the capacitor used in the branching circuit is further formed on the semiconductor substrate.

7. The even harmonic mixer according to claim 1, wherein the semiconductor substrate is flip-chip mounted on a mother substrate.

8. The even harmonic mixer according to claim 4, wherein the semiconductor substrate is flip-chip mounted on a mother substrate.

* * * * *